United States Patent [19]
Covino et al.

[11] Patent Number: 5,978,929
[45] Date of Patent: *Nov. 2, 1999

[54] COMPUTER UNIT RESPONSIVE TO DIFFERENCE BETWEEN EXTERNAL CLOCK PERIOD AND CIRCUIT CHARACTERISTIC PERIOD

[75] Inventors: Jim Covino, Montpelier; Harold Pilo, Underhill, both of Vt.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/822,912

[22] Filed: Mar. 20, 1997

[51] Int. Cl.$^6$ .................................................. G06F 1/04
[52] U.S. Cl. ............................................ 713/503; 713/600
[58] Field of Search ................................... 395/551, 552, 395/558, 559; 364/724.06, 724.08; 711/100, 104; 713/400, 401, 503, 600; 708/309, 311

[56] References Cited

U.S. PATENT DOCUMENTS

| | | | |
|---|---|---|---|
| 5,235,699 | 8/1993 | Shaffer et al. | 395/550 |
| 5,276,858 | 1/1994 | Oak et al. | 395/550 |
| 5,333,293 | 7/1994 | Bonella | 395/425 |
| 5,353,433 | 10/1994 | Sherman | 395/550 |
| 5,459,846 | 10/1995 | Hyatt | 395/421.04 |
| 5,459,855 | 10/1995 | Lelm | 395/550 |
| 5,469,561 | 11/1995 | Takeda | 395/559 |
| 5,546,354 | 8/1996 | Partovi et al. | 365/233 |
| 5,546,355 | 8/1996 | Raatz et al. | 365/233 |
| 5,566,325 | 10/1996 | Bruce, II et al. | 395/494 |

*Primary Examiner*—Dennis M. Butler
*Attorney, Agent, or Firm*—Schmeiser, Olsen & Watts; Robert A. Walsh

[57] ABSTRACT

An integrated circuit such as a SRAM is connected to receive externally generated clock cycles. A delay period is generated within the circuit which is independent of the rate of the clock cycles. The rate of the clock cycles is compared to a delay period and the operation of the integrated circuit is varied depending on the comparison. The integrated circuit adapts itself to changes in operating temperature, applied voltages, process variations which result in structural or materials differences between devices, and changes in the rate of externally generated clock cycles.

6 Claims, 7 Drawing Sheets

COMPUTER UNIT RESPONSIVE TO DIFFERENCE BETWEEN EXTERNAL CLOCK PERIOD AND CIRCUIT CHARACTERISTIC PERIOD

FIELD OF THE INVENTION

These inventions relate to adaptive integrated circuits especially those used in computer systems such as processors and memory and especially to critically timed high-speed devices. These inventions are most closely related to the field of static random access memory devices.

BACKGROUND

Computer work stations generally include one or more central processor units (CPUs), memory units, storage units, user input devices, and display devices. When the work station is turned on, a disk operating system program such as Windows or UNIX is automatically loaded into memory from a storage unit (e.g. a hard drive), and then the program is executed by the CPU. A prompt or prompt of icons appears on the display unit such as a cathode ray tube (CRT) or liquid crystal display (LCD) screen. Most current systems use a graphical interface in which a mouse is used to move a cursor onto a menu or icon to select a command and then a button on the mouse is clicked to execute the commands. Other programs such as word processors, spread sheets, and internet browsers may be executed by inserting removable media such as a floppy disk or CD-ROM into a disk drive to form a storage unit and then using an operating system command to load the program into memory and initiate execution of the program. Text is entered using a keyboard once the program is operating.

The programs include instructions and data such as numbers and characters (text). During execution the CPU transmits addresses of program instructions and data onto a plurality of parallel signal wires known as an address bus. The address bus has enough signal lines to transmit all the bits of the address simultaneously (typically 32 lines). The memory unit responds by transmitting the respective instructions or data onto a plurality of parallel signal wires known as a data bus. The data bus has enough signal lines to transmit all the bits of a memory cell (typically 32 or 64 bits) simultaneously along the parallel lines. The CPU stores the fetched data into registers (very fast memory) in the CPU and executes the fetched instructions. The instructions command the CPU to perform some activity on the numbers and characters such as add or multiply the numbers, or such as compare two characters or copy the data to some memory address. Some instructions called jumps compare data and then control the address from which subsequent instructions will be fetched depending on the comparison. This allows the CPU to execute a small section of the program in a loop—that is, the CPU executes the same series of instructions over and over again until some task is complete.

For example, while executing a graphics based word processing program, a user presses a key to replace a character on the display and then the CPU executes a series of instructions to copy a picture of the character from a font portion of memory onto a display portion of memory. The display is made up of hundreds of thousands of small dots called pixels. Each character on the display covers an area that may include 100 pixels. The display of each pixel may be controlled by several numbers. Ten instructions may be required to copy each number from the font portion to the display portion of memory. Those ten instructions would be executed over and over again in a loop for each number of each pixel until the character appeared on the display.

Leading edge work stations currently operate at a clock frequency of 200 million times per second (200 MHZ) and the operating frequency of the newest leading edge work stations have been about doubling every two years. Current design and development activities are planned for producing machines that operate as fast as 500 MHZ. Instructions are executed in a pipeline that usually completes one instruction every clock cycle so that a 500 MHZ machine would execute up to 500 million instructions per second or one instruction every 2 nano seconds (ns).

In order to achieve the highest speeds possible the communications between computer units are usually synchronized using a clock signal. That is a clock signal is generated and distributed to each unit of the computer and communications are timed according to the clock. For example, the CPU transmits a request for data at the beginning of a clock cycle and expects a response at by the end of the following clock cycle. Such clock signals are typically provided by crystal oscillators. A capacitor is formed by depositing metal on two opposite surfaces of a piezoelectric crystal. The crystal capacitor is connected in parallel to an RLC circuit with about the same frequency as the natural frequency of the crystal. The crystal stabilizes the frequency of the RLC circuit to produce a signal that closely approximates a square wave and does not drift in frequency. The output signal of the crystal circuit (clock signal) is distributed to each unit of the computer and used for synchronizing data transmission.

Data such as addresses, numbers, characters, control signals are transmitted using binary codes either electrically over copper lines or optically through glass filaments. The signal is either on or off. For electrical signals on or one is usually a positive potential such as 5 volts and off or zero is usually a low potential such as 0 volts. The signals consist of a multitude of ones and zeros. Characters are coded as binary numbers and numbers and the coded characters are transmitted as binary (base 2) numbers.

The memory of a work station operating at 500 MHZ must be capable of transmitting an instruction onto the data bus every 2 ns or the CPU would have to wait for the next instruction. Two types of devices are typically used for work station memory. Dynamic random access memory (DRAM) is relatively cheap but accessing data requires up to 60 ns. Static random access memory (SRAM) is much more expensive but much faster and is expected to operate at access speeds of 2 ns (required to feed instructions to a CPU operating at 500 MHZ). In typical work stations, most of the memory is DRAM and a much smaller portion (5 to 20%) is SRAM. The SRAM is used as a cache to store a copy of frequently used instructions and data. When instructions and data are accessed they are copied from the DRAM to the SRAM. Most programs constantly reuse small portions of the program such as loops. Depending on the program, 90% of fetches may be made from a cache that includes only 10% of the system memory.

In order to achieve higher speeds, the design of SRAM memory has to be rigorously optimized for high-speed access. Due to tolerances in the manufacturing process including both dimensional and material tolerances, many of the products produced for high speed can not pass operational testing for such speeds. Because SRAMs operate internally at a high speed the product that fails operational testing at high speed can not easily be used at a lower speed. Furthermore, operating temperatures and external voltage levels affect the internal speed of the memory so that timing may not be within tolerances during operation and computer failure may result.

U.S. Pat. No. 5,546,354 to Partovi describes an SRAM in which the internal timing can be adjusted by applying tuning signals to some of the pins so that fast SRAM that has failed testing can be used as a slower SRAM in a computer that provides such tuning signals.

U.S. Pat. No. 5,546,355 to Raatz describes a SRAM with a self-timed write pulse so that minor fluctuations in the external clock signal do not cause incorrect data to be written into the memory array. Delay elements adjust the write pulse to compensate for temperature, power supply, and process variations.

U.S. Pat. Nos. 5,566,325 to Bruce, II; 5,333,293 to Bonella; and 5,276,858 to Oak disclose adaptive approaches to timing problems using DRAM memory.

All the above citations are hereby incorporated in whole by reference.

SUMMARY OF THE INVENTION

In an integrated circuit the rate of cycles of an external clock is compared with an internally generated delay and the integrated circuit is operated depending on the comparison. The integrated circuit operation may be adapted to operate satisfactorily with a slower external clock rate, a different operating temperature, different externally applied voltages, or to provide improved noise immunity or reduced noise generation. If the chip fails to meet testing criteria for high-speed use, it could be used in a slower speed environment where it would adapt to provide identical communications as circuits designed for such slower environment. Other objectives and advantages of the invention will be described below with reference to the following drawings.

DETAILED DESCRIPTION OF THE DRAWINGS

Figure 1:
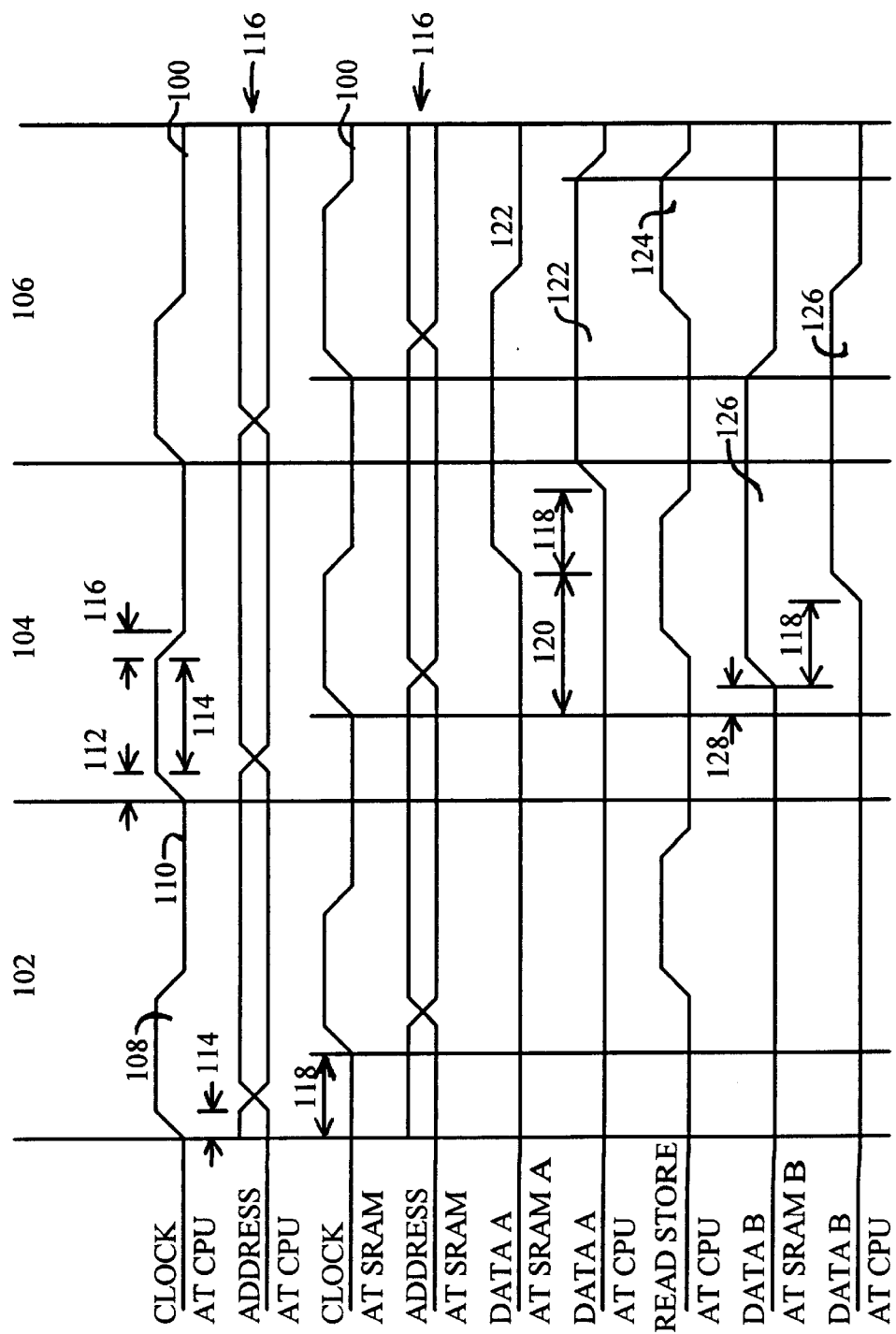
FIG. 1 is a timing diagram for communication between a CPU and a SRAM during read access.

FIG. 1 illustrates a timing diagram for a SRAM memory of the invention. Curve 100 is the clock signal that reaches the CPU. Each clock cycle 102, 104, 106 includes a pulse 108 at a higher voltage and a delay 110 at a lower voltage. Each pulse includes a ramp-up section 112, a hold section 114, and a ramp-down section 116. The ramps are primarily caused by distributed resistance and inductance in the signal distribution lines. The length of the ramps depend on the length of the line and on other structural factors including the proximity to other lines and to voltage planes.

The CPU receives the rising ramp of the clock pulse at the beginning of a clock cycle. After a short delay 114 the CPU begins to transmit an address signal 116 on the address bus. The time required for the signal to travel is known as the propagation delay which is calculated as follows:

$$t_{pd} \sqrt{LC}$$

where L' is the distributed inductance and C' is the distributed capacitance of the line. A typical value for $t_{pd}$ in current circuit boards is 0.07 ns/cm. The SRAM packages may be mounted 5 to 10 cm from the CPU resulting in a delay of about 0.35 to 0.7 ns.

As shown in FIG. 1, SRAM A receives the clock cycle 100 after a propagation delay 118 and receives the address signal 116 shortly thereafter. During the next clock cycle SRAM A decodes the address and after access delay 120, transmits one or more bits of the memory array onto the data bus during the next clock cycle. Several SRAMS usually operate together each providing some of the bits of data. The data remains on the data bus until the subsequent data transmission. During the next clock cycle 106 the CPU copies the data 122 into a register during read strobe 124.

The current SRAMs are sorted for minimum access delay 120. The corresponding minimum cycle time and data hold time are shown in the following table:

| Cycle Time | 4 ns | 5 ns | 6 ns | 7 ns |
|---|---|---|---|---|
| Access Time | 2.0 ns | 2.5 ns | 3.0 ns | 3.5 ns |
| Data Hold Time | 0.5 ns | 0.75 ns | 1.0 ns | 1.25 ns |

The data must remain on the data bus until the end of the read strobe to guarantee reliable reading by the CPU. If the SRAM is too fast then the data hold time will not provide enough time to allow the CPU to read the data. For example, a SRAM B is faster than SRAM A and is able to provide data 126 on the data bus after a much shorter delay period 128. Due to the short data hold time the data from the memory is replaced by the data of the subsequent read before the CPU read strobe is complete. The result is that data in the read register of the CPU may be corrupted with the data of the subsequent read.

Figure 2:
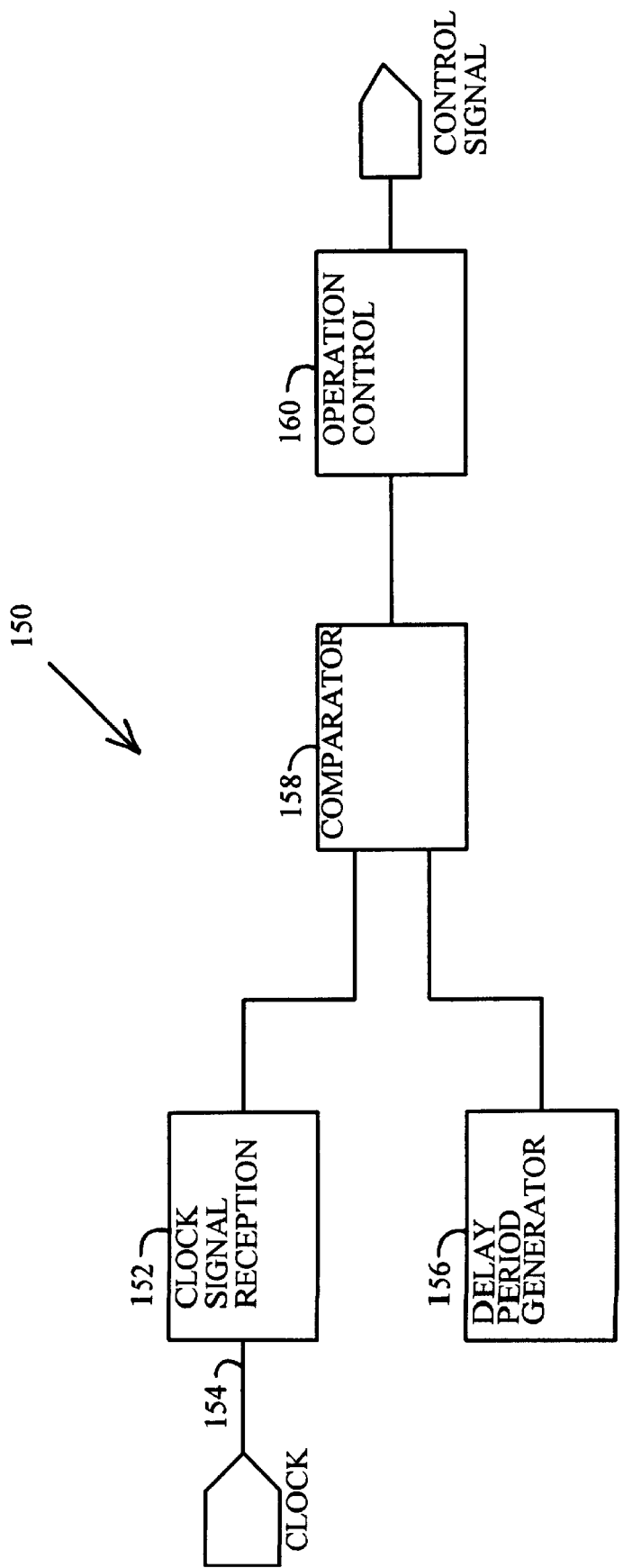
FIG. 2 is a block diagram of a fundamental integrated circuit embodiment of the invention.

FIG. 2 shows the essential components of an integrated circuit 150 embodiment of the invention. Block 152 receives external clock cycles 154 into the integrated circuit. For example, the connection may include a receiving circuit and a counter to hold the number of clock cycles. A delay period generator 156 of the integrated circuit operates electronic devices of the circuit (e.g. logic gates or registers) to produce a signal after a delay period which is independent of the rate of the external clock. The delay period may be related to the operating temperature, externally applied voltages, or to the specific structure of the device. Preferably the delay period is initiated by a clock pulse. A comparator 158 includes logic to compare the delay period and a period required for one or more clock cycles. For example the comparator may report the number of clock cycles received during a fixed delay period or may report the length of the delay period in relation to a fixed number of clock cycles.

An operation controller 160 controls the operation of the integrated circuit depending on the comparison made by comparator 158. The operation control circuit is intended to automatically adapt the operation of the integrated circuit to function reasonably regardless of external conditions such as operating temperature, clock signal rate or applied voltages, and regardless of internal conditions such as out of tolerance materials or structural dimensions. The control circuit allows design choices to be transferred into operation choices which are made automatically by the integrated circuit. For example, instead of choosing between a fast, noisy output driver circuit and a slower, quieter output driver circuit, both the fast and the quiet output driver circuits are provided in the integrated circuit and the control circuit of the integrated circuit automatically adjusts output driver behavior based on application conditions and external clock rate.

Figure 3:
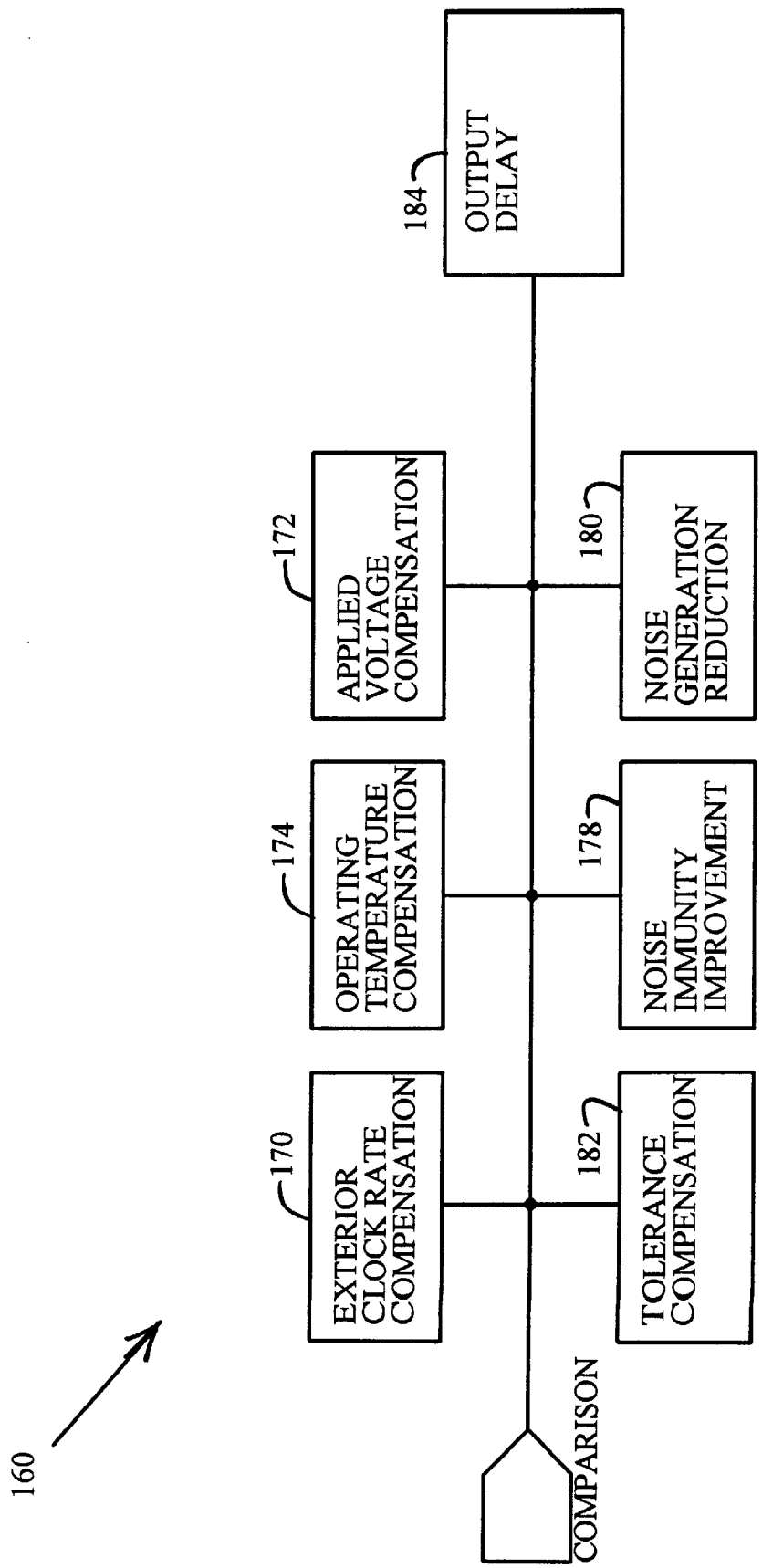
FIG. 3 is a block diagram showing more details of the operation control block of FIG. 2.

FIG. 3 is a more detailed embodiment of the operation control 160 of FIG. 2. The operation controller may include an exterior clock rate compensation circuit 170 to automatically adjust the speed of the integrated circuit operations, depending on the rate of external clock cycles. If the rate of the external clock is relatively slower, then additional delay in output may be required to meet output signal specifications for the slower external clock speed. On the other hand if the rate of external clock cycles speeds up, faster circuits which are less noise-immune or which generate more noise, may be used to speed up operations of the circuit. To some extent adapting to changes in the external clock rate with relation to the internally generated delay can automatically compensate for changes in externally applied voltages and/or to changes in operating temperature if the devices used to generate the delay have about the same dependence on applied voltages and/or operating temperatures as other parts of the integrated circuit. Alternatively, sensor circuits may be used to detect operating temperature and applied voltages independent of the rate of operation of the circuit. Some internal logic operations may require more time at higher temperatures and less time at lower temperatures depending on the devices used in the circuit. A difference in delay time generated by circuits using different devices may be used to determine the relative effect of temperature and that determination used to introduce delays or switch to faster circuits for some functions.

The operation controller may include voltage adaption circuits 172 to automatically adjust the speed of integrated circuit operations to compensate for changes in externally applied voltages. The operation controller may include thermal adaption circuits 174 to automatically adjust the speed of integrated circuit operations to compensate for changes in operating temperature. The operation controller may include tolerance adaption circuits 182 to adapt the speed of the integrated circuit operation to compensate for tolerances in physical structure, including materials of the circuit. If some part of the circuit is not able to operate as quickly as required, then circuit operation may switch to back-up circuits which are faster but potentially more noisy or less noise-immune circuits which are able to meet the speed requirements. Speed performance problems that are detected during initial circuit testing may be solved by using the circuit in a system with a slower clock and the integrated circuit may adapt to the slower clock as discussed above. Otherwise speed performance problems may be detected during device operation either internally or externally and a signal generated which causes the integrated circuit to select other circuits to operate more quickly.

The operation controller may include noise immunity circuits 178 to increase the noise immunity of the circuit if the rate of operation of the circuit is sufficiently high with respect to the rate of the external clock. This could be done by switching to use a slower but more noise-immune circuit, if the performance of the integrated circuit were sufficient relative to the external clock speed. That is, if the difference between the rate of external clock cycles and an internal delay period is sufficient then more noise-immune circuits may be operated. The operation controller may include a noise-reduction circuit 180 to automatically decrease the noise generation of an output driver circuit in response to a reduced rate of external clock cycles (slower cycle) or a signal indicating that noise needs to be reduced. Again, this could be done by switching to use a slower, less noisy circuit if the performance of the integrated circuit was sufficient relative to the external clock speed. The operation controller may include a tolerance compensation circuit 182 for adapting the circuit to structural differences in the circuit. For example, for some function of the integrated circuit, the operation controller can choose a faster circuit if process changes would otherwise cause the circuit to operate slower. That is, choose a circuit less sensitive to small changes in the structure of the circuit due to process changes or choose a slower circuit that is less sensitive to process changes. The operation controller may include an output delay circuit 184 to automatically increase output delay times in response to an increase in difference between the rate of external clock cycles and the internal delay period.

Figure 4:
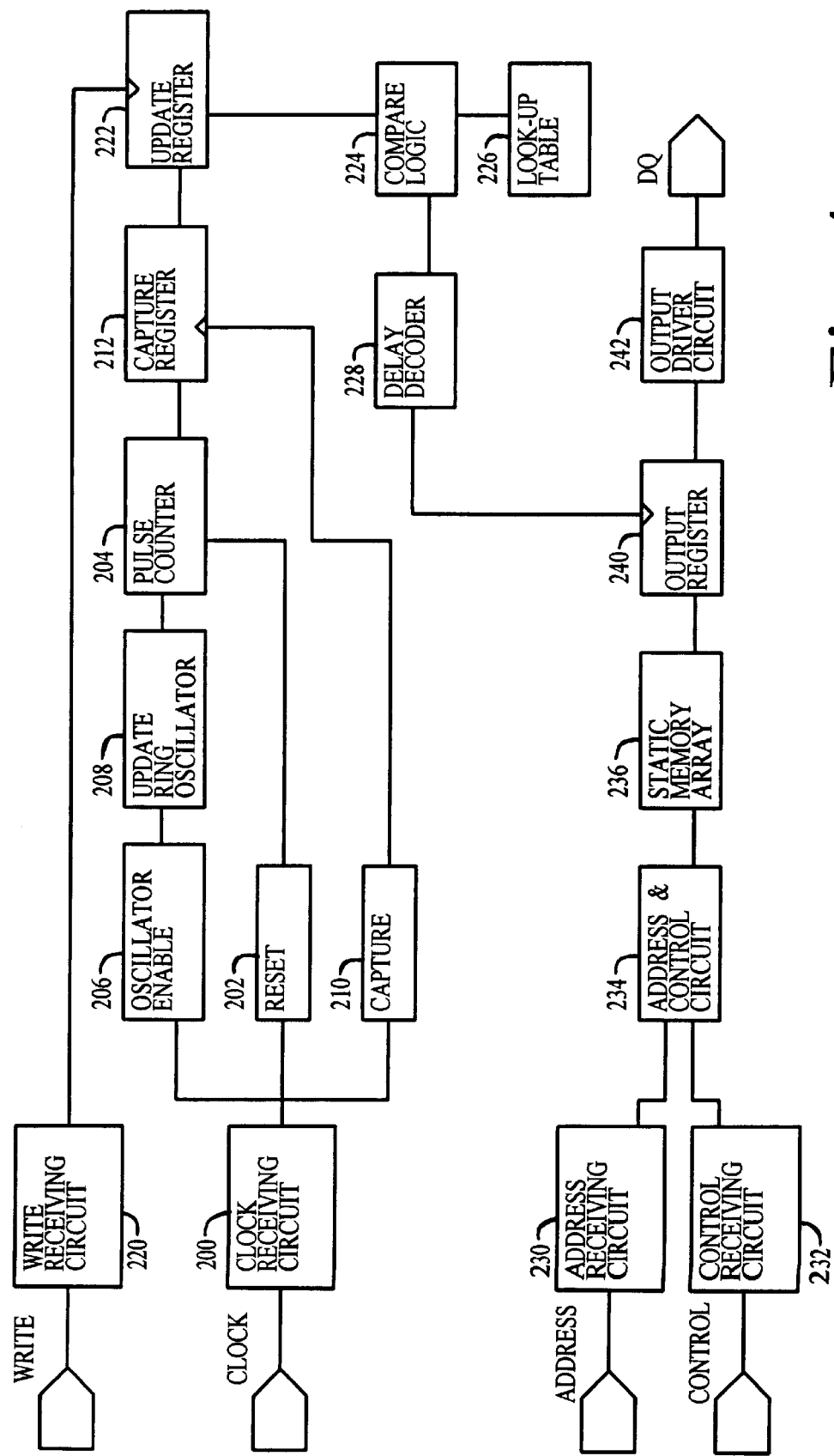
FIG. 4 is a block diagram of a specific embodiment of the invention in which data output from a SRAM is delayed.

FIG. 4 is a block diagram presenting a specific embodiment of the invention which is implemented in a static random access memory (SRAM) unit of a computer. The SRAM includes a clock receiving circuit 200 for receiving externally generated clock cycles into the SRAM.

In this embodiment every 128 cycles the SRAM updates an output delay. In the first cycle, reset circuit 202 clears pulse counter 204 and in the following clock cycle enable circuit 206 enables the ring oscillator circuit 208. The ring oscillator typically cycles at least once per clock cycle, and preferably several times per clock cycle depending on the clock rate. In this specific embodiment the ring oscillator circuit cycles at a fixed rate of about 0.25 ns depending on externally applied voltage, operating temperature and processing variables. The oscillator cycle rate is independent of the clock cycle rate.

Capture circuit 210 counts the number of external clock cycles since reset. After 8 additional clock cycles the capture circuit 210 signals to copy the current oscillator pulse count from the pulse counter into capture register 212. The capture register contains the number of oscillator pulses generated during a fixed number of external clock cycles. Alternatively, the circuit could easily be revised to capture the number of clock pulses during a fixed number of oscillator cycles. Either method produces a signal indicating the performance of the SRAM.

Whenever data is written to the SRAM, a write enable is received into the write receiving circuit 220. Then the pulse count is copied into the update register 222 after which compare logic circuit 224 compares pulse value ranges stored in look-up table 226 with the pulse count and selects a delay value associated with one of the pulse count ranges. Then the compare logic transmits the value in a delay signal which is provided by delay decoder 228.

During each read or write cycle externally generated address signals are received into the address receiving circuit 230 and externally generated control signals are received into the control receiving circuit 232. Address and control circuit 234 is connected to receive the address and control signals and the circuit generates decoded addresses and control signals for static memory array 236. During each data read from the SRAM the output data is presented by an output register 240 which is controlled depending on the delay value provided by the delay decoder. The data is transmitted out of the SRAM by output driver circuit 242. The register is controlled to delay the beginning and end of the data signal transmission relative to the input to the register, and the delay is controlled depending on the distributed delay value provided by the delay decoder.

Figure 5:
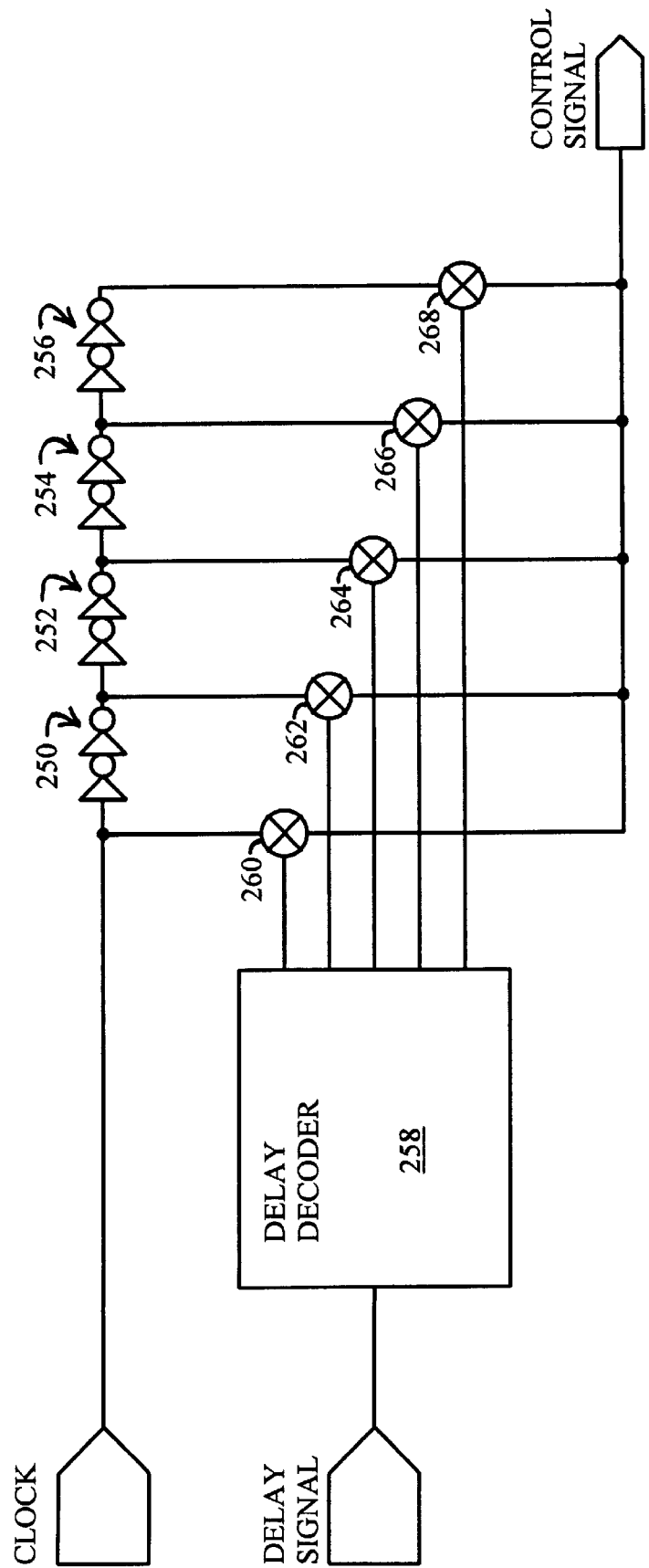
FIG. 5 shows an alternate embodiment of a portion of FIG. 4.

FIG. 5 shows a delay decoder 258 in which the clock signal is directed through a series of multi-gates 250, 252,

254, 256. Each multi-gate is shown as two invertors but may be implemented as other types of gates and may need to include many more gates than shown. Delay decoder 258 produces one output on only one of the signal lines to switches 260, 262, 264, 266, 268.

In this embodiment the output of the SRAM is delayed by using an output register to delay the output of the memory array. Alternatively, an input register could be used to delay the arrival of control signals to the memory array and then the output of the memory array could be directly transmitted to the output driver circuit.

The circuit of FIG. 4 directly controls the delay time of the data output of a memory array in a SRAM device. Also, this circuit may be used to adjust the delay to compensate for variances in applied voltage and changes in operating temperature, and structural variations, including tolerances in geometry and materials. Preferably the ring oscillator circuit has about the same sensitivity to changes in voltage, temperature, and device structure as the other circuit of the SRAM so that the delay is automatically adjusted to compensate for all these effects. Alternately, solid state sensors that are specifically sensitive to temperature and voltage are well known in the art and may be included to allow specific compensation for these variances. Also, special circuits can be used to test for performance changes due to processing the structures of the integrated circuit. For example, the speed of PMOS type devices can be separately tested from the speed of NMOS type devices by generating respective delays of test circuits of each type of device and comparing the delays to the clock rate.

Figure 6:
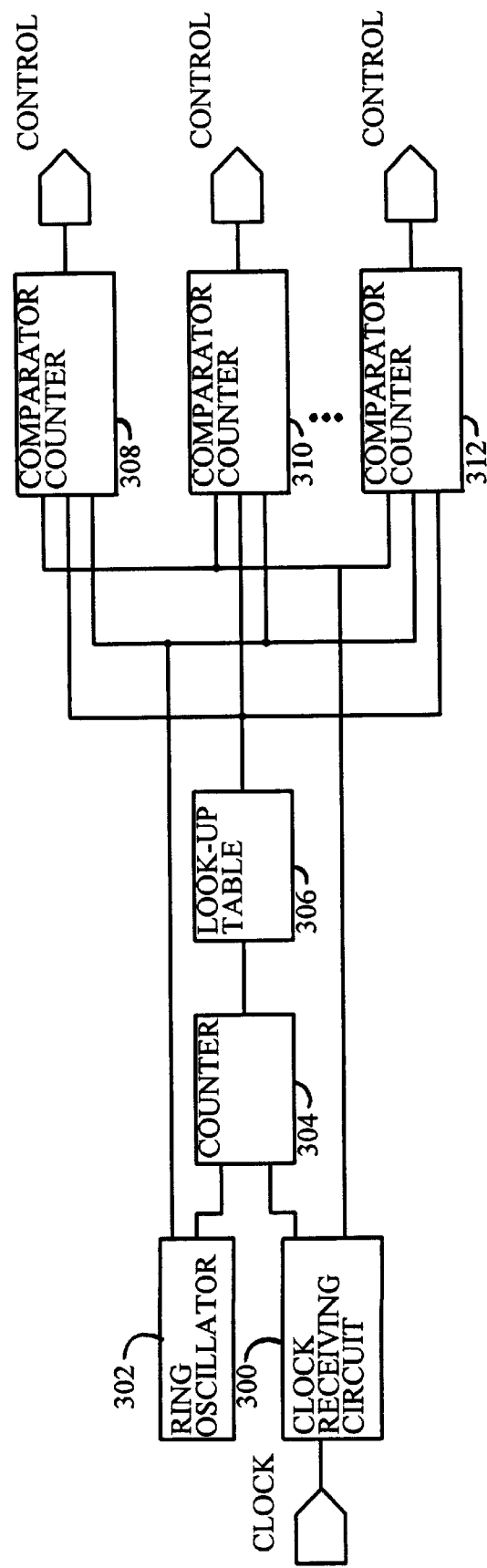
FIG. 6 is a block diagram in which several operations of an integrated circuit are delayed.

FIG. 6 illustrates a portion of in integrated circuit of the invention in which clock receiving circuit 300 receives a pulse during each cycle of an external clock. Ring oscillator 302 also generates pulses at a constant rate which is independent of the rate of the clock cycles. Counter 304 counts the oscillator pulses during a fixed number of clock cycles or counts the clock pulses during a fixed number of oscillator cycles. Look-up table 306 translates the number of pulses or cycles counted into a delay count. The delay count is transmitted across the integrated circuit to local comparator/counters 308, 310, and 312 which compare ring oscillator cycles to the delay count and output a control signal when the count is reached. Each control signal controls a different respective portion of the integrated circuit.

Figure 7:
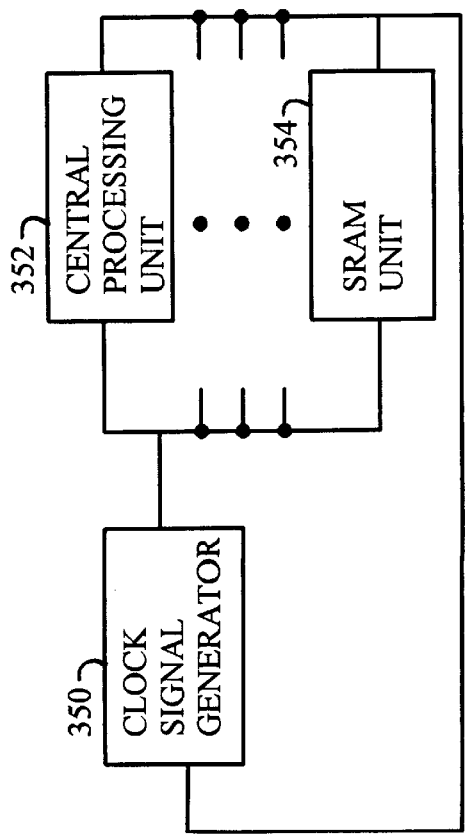
FIG. 7 is a block diagram of a computer system of the invention.

FIG. 7 illustrates a computer system of the invention in which a clock generating circuit 350 with a variable clock rate transmits a clock signal to a multitude of computer units including CPU 352 and a SRAM unit 354. One or more of the units transmit error signals back to the clock generating unit allowing the clock to determine the maximum cycle rate at which the computer system can be reliably operated. One or more of the computer units then adjust their operation according to the maximum clock rate determined.

Figure 8:
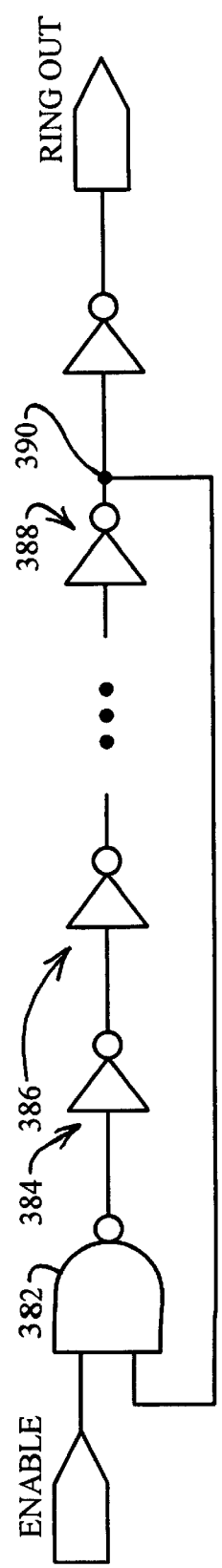
FIG. 8 shows a ring oscillator embodiment.

FIG. 8 shows a ring oscillator circuit 380. When NAND gate 382 (or AND gate or XOR gate) starts to receive a constant enable signal then the gate will output a first signal level. The signal is delayed as it travels through a multitude of logic gates such as invertors 384, 386, and 388 and then back to gate 382. When the first signal level reaches gate 382 the output from gate 382 will switch to a different second signal level until the second signal level reaches gate 382. An output signal connection 390 can be connected anywhere along the signal path and different clock signals can be generated by connecting at different places along the path. The output signal of the ring oscillator has a cycle time which is twice the delay time around the circuit and the rate is very stable but depends on temperature, applied voltages, and process parameters that affect the structure of the circuit.

These inventions have been described with reference to specific embodiments including the best mode for carrying out the inventions, and with sufficient detail that anyone skilled in the art can utilize the invention. Those skilled in the art may modify these embodiments within the spirit of the invention, and thus, the description does not limit the present invention to the disclosed embodiments. The invention is limited only by the following appended claims.

We claim:

1. An integrated circuit comprising:

a connection for receiving external clock cycles into the integrated circuit;

means within the integrated circuit, for generating pulses independent of the external clock cycles, wherein the generated pulses are a function of a tolerance compensation circuit that detects performance changes due to structural processing of the integrated circuit;

means for comparing generated pulses with external clock cycles during a fixed period; and means for controlling the operation of the integrated circuit depending on the comparison.

2. The integrated circuit of claim 1 in which:

the means for controlling the operation of the integrated circuit include means to automatically adjust the speed of the integrated circuit depending on the rate of external clock cycles;

the means for controlling the operation of the integrated circuit include means to automatically adjust the speed of the integrated circuit to compensate for changes in externally applied voltages;

the means for controlling the operation of the integrated circuit include means to automatically adjust the speed of the integrated circuit to compensate for changes in operating temperature;

the means for controlling the operation of the integrated circuit include means to automatically adjust the speed of the integrated circuit to compensate for tolerances in physical structure including materials of the integrated circuit;

the means for controlling the operation of the integrated circuit include means to automatically increase the noise immunity of a signal receiving circuit in response to a comparison between the rate of external clock cycles and the internal delay period;

the means for controlling the operation of the integrated circuit include means to automatically decrease the noise generation of an output driver circuit in response to a comparison between the rate of external clock cycles and the internal delay period; and the means for controlling the operation of the integrated circuit include means to automatically control data output hold time in response to a comparison between the rate of external clock cycles and the internal delay period.

3. The integrated circuit of claim 1, comprising:

means for receiving external clock cycles into the integrated circuit;

means for counting the external clock cycles;

ring oscillator means within the integrated circuit for generating pulses at a fixed rate, wherein the fixed rate is unrelated to the external clock period;

means for storing a count equal to the number of generated pulses within a fixed number of the external clock cycles;

means for resetting the count of received external clock cycles and the stored count of generated pulses;

means for comparing the count of generated pulses with predetermined values in a look-up table;

means for distributing a signal depending on the comparison; and means for delaying the transmission of a signal from the integrated circuit after receiving an external initiating signal, depending on the distributed signal.

4. A static random access memory, comprising:

means for receiving externally generated address signals and control signals including externally generated clock cycles;

an address and control circuit connected to receive the external address signals and control signals, for providing interior control signals and decoded address signals;

an array of memory cells connected to receive the decoded address signals and interior control signals;

means for comparing a period associated with the external clock cycles with a cycle period that characterizes the performance of the random access memory;

means for generating a delay signal depending on the comparison; and means for delaying an output of data from the static random access memory depending on the delay signal.

5. A computer system, comprising:

means to generate clock cycles at a constant rate;

a multitude of units of the computer communicating to receive the clock cycles;

one of the units operating cyclically including means for comparing the rate of the clock cycles with a cycle rate of the one unit, wherein the cycle rate of the one unit is dependent upon internal and external conditions, and is independent of the clock cycles; and means for modifying the operation of the computer system depending on the comparison.

6. The computer system of claim 5 in which:

the means to generate clock cycles automatically adjusts the constant rate of clock cycles to achieve the highest reliable clock rate;

the one unit is a static random access memory communicating with the central processing unit to receive memory addresses from the central processing unit and to transmit data that is stored at the addresses in the memory unit, to the central processing unit;

the means for comparing the rate of the clock cycles with the cycle rate of the one unit include:
- a ring oscillator circuit to generate pulses at a rate independent of the pulse rate of the clock signal;
- a register to store an accumulated count of pulses of either the ring oscillator or clock signal during a fixed number of pulses of the other of the ring oscillator or clock signal;
- a look-up table containing predetermined values and related predetermined delay signals; and
- comparator logic to select one of the predetermined values in the table depending on the count and to transmit the related delay signal depending on the selected value; and the means for modifying include:
- a second ring oscillator circuit to generate a multitude of pulses during each clock cycle;
- a register to store an accumulated count of pulses of the second ring oscillator since the previous clock pulse;
- a circuit to compare the accumulated count of pulses with the delay signal; and
- a circuit to control data transmission delay of the one unit depending on the comparison.

* * * * *